United States Patent
van Soestbergen et al.

(10) Patent No.: US 12,061,228 B2
(45) Date of Patent: Aug. 13, 2024

(54) DEGRADATION MONITOR FOR BOND WIRE TO BOND PAD INTERFACES

(71) Applicant: NXP B.V., Eindhoven (NL)

(72) Inventors: Michiel van Soestbergen, Wageningen (NL); Amar Ashok Mavinkurve, Malden (NL)

(73) Assignee: NXP B.V., Eindhoven (NL)

( * ) Notice: Subject to any disclaimer, the term of this patent is extended or adjusted under 35 U.S.C. 154(b) by 39 days.

(21) Appl. No.: 17/805,555

(22) Filed: Jun. 6, 2022

(65) Prior Publication Data

US 2023/0393192 A1    Dec. 7, 2023

(51) Int. Cl.
    *G01R 31/28*     (2006.01)

(52) U.S. Cl.
    CPC ................. *G01R 31/2889* (2013.01)

(58) Field of Classification Search
    None
    See application file for complete search history.

(56) References Cited

U.S. PATENT DOCUMENTS

| | | | | |
|---|---|---|---|---|
| 5,485,095 A * | 1/1996 | Bertsch | .............. | G01R 31/2884 714/733 |
| 5,654,896 A * | 8/1997 | Ochi | .............. | G01R 31/30 716/139 |
| 5,751,015 A * | 5/1998 | Corbett | .............. | H01L 22/34 257/210 |
| 6,037,795 A | 3/2000 | Filippi et al. | | |
| 7,102,377 B1 * | 9/2006 | Blanchet | .............. | G01R 31/2856 324/762.02 |
| 7,446,419 B1 * | 11/2008 | Lin | .............. | H01L 21/6835 438/106 |
| 7,825,672 B2 | 11/2010 | Peck et al. | | |
| 10,026,714 B2 | 7/2018 | Moran et al. | | |
| 2006/0194353 A1 | 8/2006 | Spuhler et al. | | |
| 2008/0088335 A1 | 4/2008 | Blanchet et al. | | |

(Continued)

FOREIGN PATENT DOCUMENTS

| | | |
|---|---|---|
| CN | 101220781 B | 8/2014 |
| DE | 102017109266 A1 | 10/2018 |

OTHER PUBLICATIONS

Cauchois et al., "Wire-Bonding on Inkjet-Printed Silver Pads Reinforced by Electroless Plating for Chip on Flexible Board Packages," 3rd Electronics System Integration Technology Conference ESTC, 2010, 6 pages.

*Primary Examiner* — Eman A Alkafawi
*Assistant Examiner* — Suresh K Rajaputra

(57) ABSTRACT

A device comprises a substrate and a stacked bond ball structure. The substrate comprises a bond pad, and the stacked bond ball structure comprises a first and a second bond ball. The first bond ball is in contact with the bond pad, and the second bond ball is positioned on the first bond ball. The stacked bond ball structure is configured to be coupled to a resistance-sensing circuit, such that a resistance of an interface between the first bond ball and the bond pad can be measured to determine an amount of degradation of the interface between the first bond ball and the bond pad. In some implementations, the device further comprises a controller configured to obtain a measured resistance of the interface from the resistance-sensing circuit and determine the amount of degradation of the interface based at least in part on the measured resistance.

26 Claims, 7 Drawing Sheets

(56) References Cited

U.S. PATENT DOCUMENTS

| | | |
|---|---|---|
| 2009/0015285 A1 | 1/2009 | Farooq et al. |
| 2010/0088478 A1 | 4/2010 | Carson et al. |
| 2010/0253372 A1* | 10/2010 | Rousseville ............ H01L 22/34 |
| | | 324/705 |
| 2013/0087915 A1 | 4/2013 | Warren et al. |
| 2014/0021978 A1* | 1/2014 | Ikeda ................. G01R 31/2889 |
| | | 324/762.06 |
| 2014/0091829 A1 | 4/2014 | Yamayose et al. |
| 2019/0242940 A1 | 8/2019 | Michallick et al. |
| 2020/0200883 A1 | 6/2020 | Gilliland et al. |
| 2020/0210354 A1 | 7/2020 | Fayneh et al. |
| 2020/0249271 A1* | 8/2020 | Ashok Kumar ... G01R 31/2884 |

* cited by examiner

DEGRADATION MONITOR FOR BOND WIRE TO BOND PAD INTERFACES

BACKGROUND

Integrated circuits are used in safety-critical systems, such as driver assistance systems and medical devices. As a result, monitoring the wear and degradation of components in safety-critical systems may be important to maintain operational integrity and reliability.

SUMMARY OF THE INVENTION

A device comprises a substrate and a stacked bond ball structure. The substrate comprises a bond pad, and the stacked bond ball structure comprises a first bond ball in contact with the bond pad and a second bond ball positioned on the first bond ball. The stacked bond ball structure is configured to be coupled to a resistance-sensing circuit such that a resistance of an interface between the first bond ball and the bond pad can be measured to determine an amount of degradation of the interface between the first bond ball and the bond pad. In some implementations, the device further comprises a controller configured to obtain a measured resistance of the interface between the first bond ball and the bond pad from the resistance-sensing circuit and determine the amount of degradation of the interface based at least in part on the measured resistance of the interface.

In some implementations, the bond pad is a first bond pad, and the substrate further comprises second and third bond pads electrically connected to the first bond pad. The device further comprises a third bond ball in contact with the second bond pad, a fourth bond ball in contact with the third bond pad, and the resistance-sensing circuit. The resistance-sensing circuit comprises a current sensor configured to measure a current between the stacked bond ball structure and the third bond ball and a voltage sensor configured to measure a voltage between the stacked bond ball structure and the fourth bond ball. The controller is configured to determine the measured resistance of the interface between the first bond ball and the first bond pad based on a measured current from the current sensor and a measured voltage from the voltage sensor.

In some implementations, the device further comprises a first semiconductor die and a second semiconductor die. The first semiconductor die comprises the substrate, the stacked bond ball structure, and the third and fourth bond balls. The second semiconductor die comprises the controller. In some implementations, the resistance-sensing circuit is comprised on one of the first semiconductor die, the second semiconductor die, and a third semiconductor die.

The bond pad is a first bond pad, and the stacked bond ball structure is a first stacked bond ball structure, in some implementations. The substrate further comprises a second bond pad electrically connected to the first bond pad. The device further comprises a second stacked bond ball structure and the resistance-sensing circuit. The second stacked bond ball comprises a third bond ball in contact with the second bond pad and a fourth bond ball positioned on the third bond ball. The resistance-sensing circuit comprises a current sensor configured to measure a current between the first bond ball and the third bond ball and a voltage sensor configured to measure a voltage between the second bond ball and the fourth bond ball. The controller is further configured to determine the measured resistance of the interface between the first bond ball and the first bond pad based on a measured current from the current sensor and a measured voltage from the voltage sensor.

In some implementations, a first semiconductor die comprises the substrate and the first and second stacked bond ball structures, and a second semiconductor die comprises the controller. The resistance sensing circuit is comprised on one of the first semiconductor die, the second semiconductor die, and a third semiconductor die. In some implementations, the controller is further configured to obtain sensor data from a sensor and to determine the amount of degradation of the interface further based on the sensor data. The sensor data comprises at least one of temperature data, humidity data, and contamination data.

An apparatus comprises a substrate, an embedded degradation sensor, and a controller. The substrate comprises a bond pad, and the embedded degradation sensor is coupled to the bond pad. The embedded degradation sensor comprises a first bond ball in contact with the first bond pad, a second bond ball positioned on the first bond ball, and a resistance-sensing system configured to measure a resistance of an interface between the first bond ball and the bond pad. The controller is configured to determine an amount of degradation of the interface between the first bond ball and the bond pad based at least in part on the resistance of the interface. In some implementations, the controller is further configured to determine a remaining useful life of wire bonds in the apparatus based on the amount of degradation of the interface.

In some implementations, the apparatus further comprises a sensor, and the controller is further configured to obtain sensor data from the sensor and determine the amount of degradation of the interface further based on the sensor data. The sensor is one of a temperature sensor, a humidity sensor, and a contamination sensor, in some implementations. The apparatus further comprises, in some implementations, a memory configured to store historical sensor data, and the controller is configured to determine the amount of degradation of the interface further based on the historical sensor data. The apparatus further comprises, in some implementations, a memory configured to store historical resistance data, and the controller is configured to determine the amount of degradation of the interface further based on the historical resistance data.

A method comprises measuring a resistance of an interface between a stacked bond ball structure and a bond pad and estimating, based at least in part on the measured resistance of the interface, a remaining useful life of wire bonds in a device comprising the stacked bond ball structure. In some implementations, measuring the resistance of the interface comprises measuring a voltage across the interface and measuring a current through the interface. In some implementations, the method further comprises obtaining at least one of temperature data, humidity data, and contamination data for the stacked bond ball structure and determining the remaining useful life further based on the at least one of the temperature data, the humidity data, and the contamination data. In some implementations, the method further comprises storing, in a memory, the measured resistance of the interface; measuring, at a later time, the resistance of the interface to obtain an updated measured resistance; and estimating, based at least in part on the updated measured resistance and the stored measured resistance, an updated remaining useful life of wire bonds in the device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

As disclosed herein, an apparatus includes a substrate comprising a bond pad, an embedded degradation sensor coupled to the bond pad, and a controller. The embedded degradation sensor includes a first bond ball in contact with the bond pad, a second bond ball positioned on the first bond ball, and a resistance-sensing system configured to measure a resistance of an interface between the first bond ball and the bond pad. The controller is configured to determine an amount of degradation of the interface between the first bond ball and the bond pad based at least in part on the resistance of the interface. The apparatus can act as a digital twin and allow the system to predict a remaining useful life of wire bonds in the apparatus.

Figure 1:
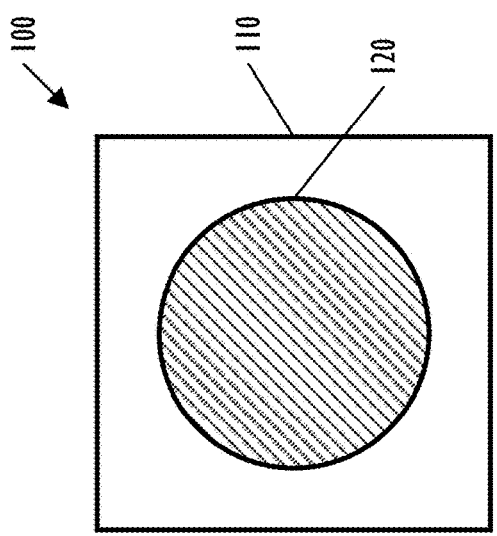
FIG. 1 shows a planar view of a bond pad to bond ball interface.
Figure 2:
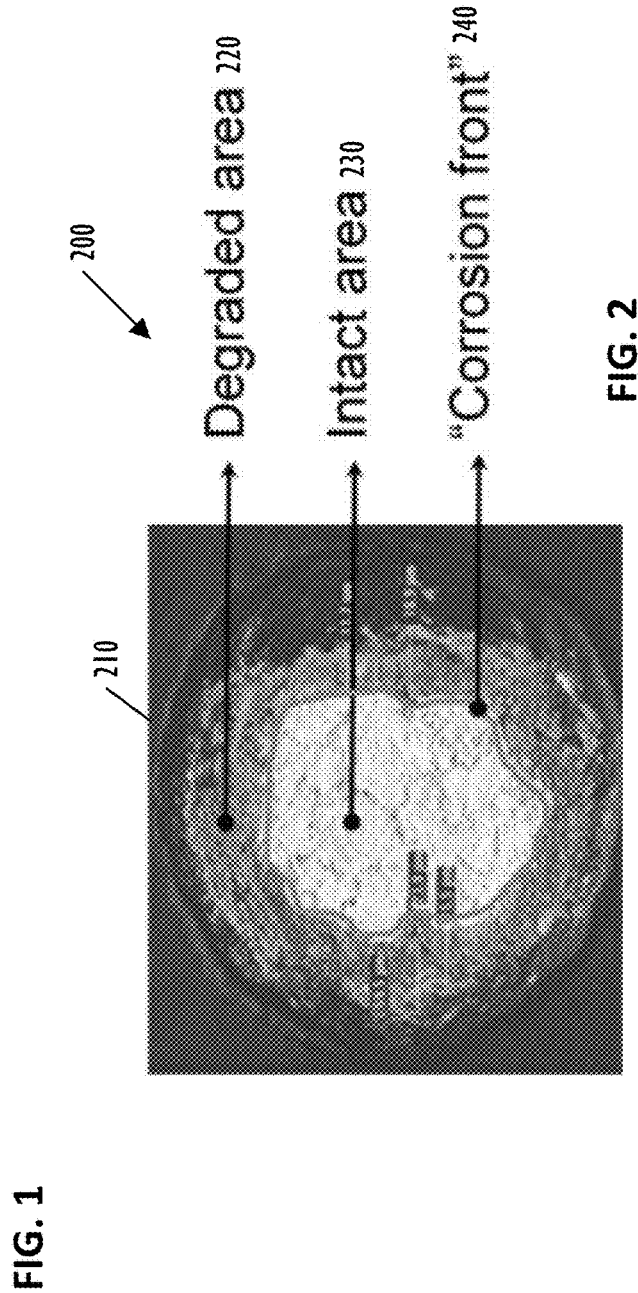
FIG. 2 shows a planar view of a degraded bond pad to bond ball interface after etching of the ball bond.

FIG. 1 shows a planar view 100 of a bond pad to bond ball interface. The bond pad 110 shows an intact, undegraded interface 120 between the bond pad 110 and the bond ball. However, mechanisms such as corrosion and Kirkendall voids can degrade the interface between the bond pad 110 and the bond ball. For example, the bond pad 110 can be aluminum, and the bond ball can be copper, which is susceptible to corrosion. The planar view 200 in FIG. 2 shows a degraded bond pad to bond ball interface. The bond pad 210 shows a small, intact area 230 of the interface between the bond pad 210 and the bond ball, and a corrosion front 240 between the intact area 230 and the degraded area 220. The degradation of the bond pad to bond ball interface may change the characteristics of the interface, for example the resistance of the interface.

Figure 3:
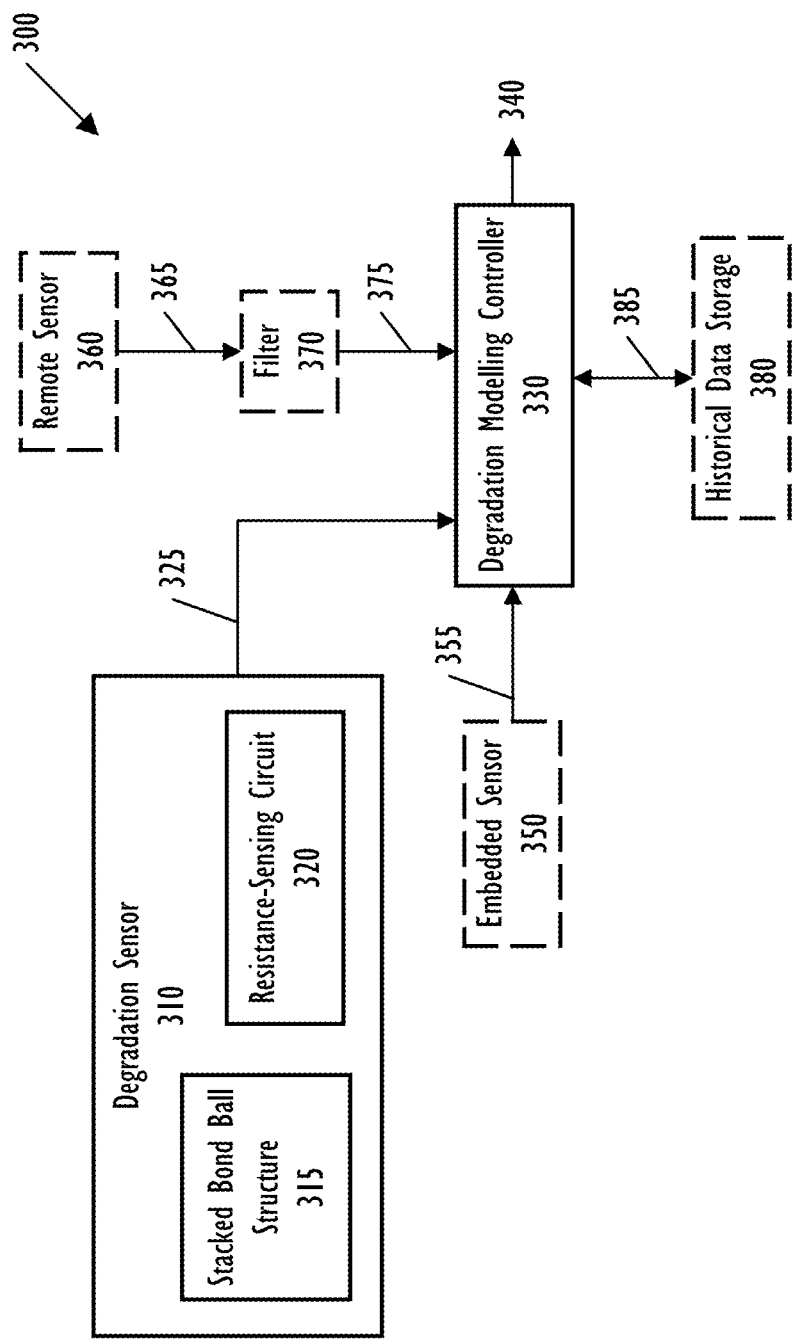
FIG. 3 shows, in block diagram form, an example digital twin system for monitoring degradation in a bond pad to bond ball interface.

FIG. 3 shows, in block diagram form, an example digital twin system 300 for monitoring degradation in a bond pad to bond ball interface such as the interface 120 shown in FIG. 1. The digital twin system 300 includes a degradation sensor 310 and a degradation modelling controller 330. The digital twin system 300 can also include one or more of the optional embedded sensor 350, remote sensor 360, filter 370, and historical data storage 380, denoted with dashed-line borders. The degradation modelling controller 330 can be any appropriate digital logic circuit, such as one or more central processing units, digital signal processors, application specific integrated circuits, microcontrollers and the like.

Figure 4:
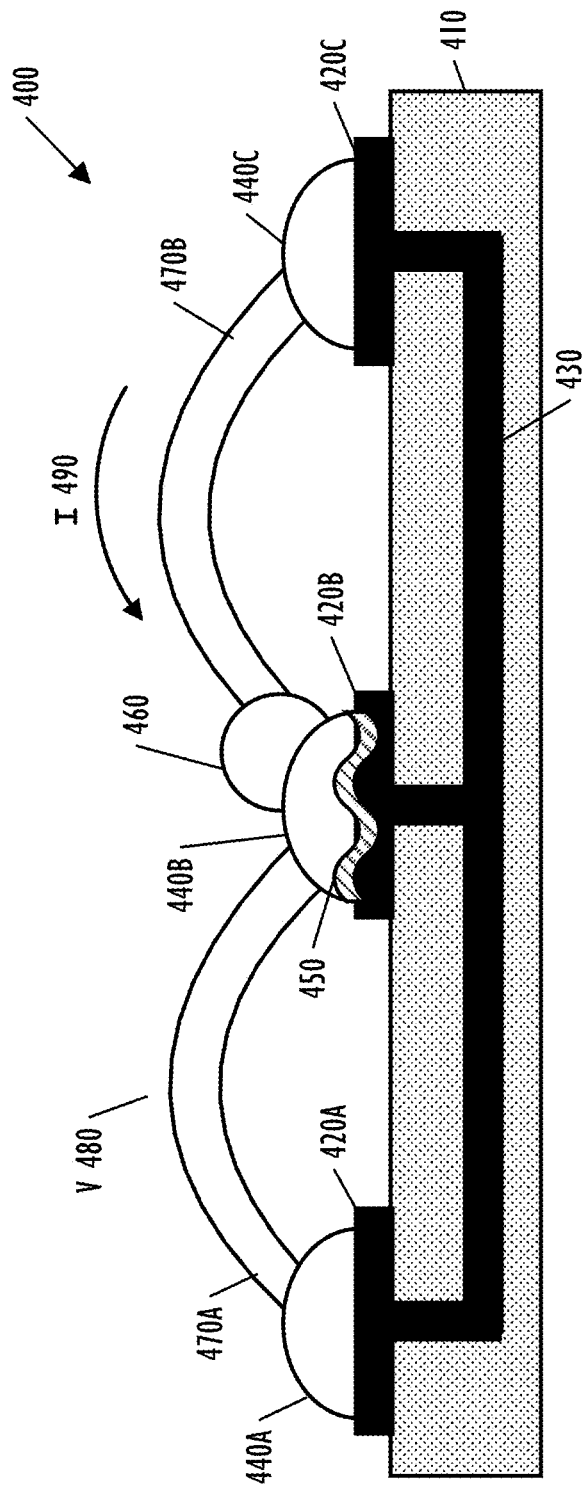
FIG. 4 shows a cross section of an example integrated circuit with a stacked bond ball structure for the degradation sensor in the digital twin system shown in FIG. 3.
Figure 5:
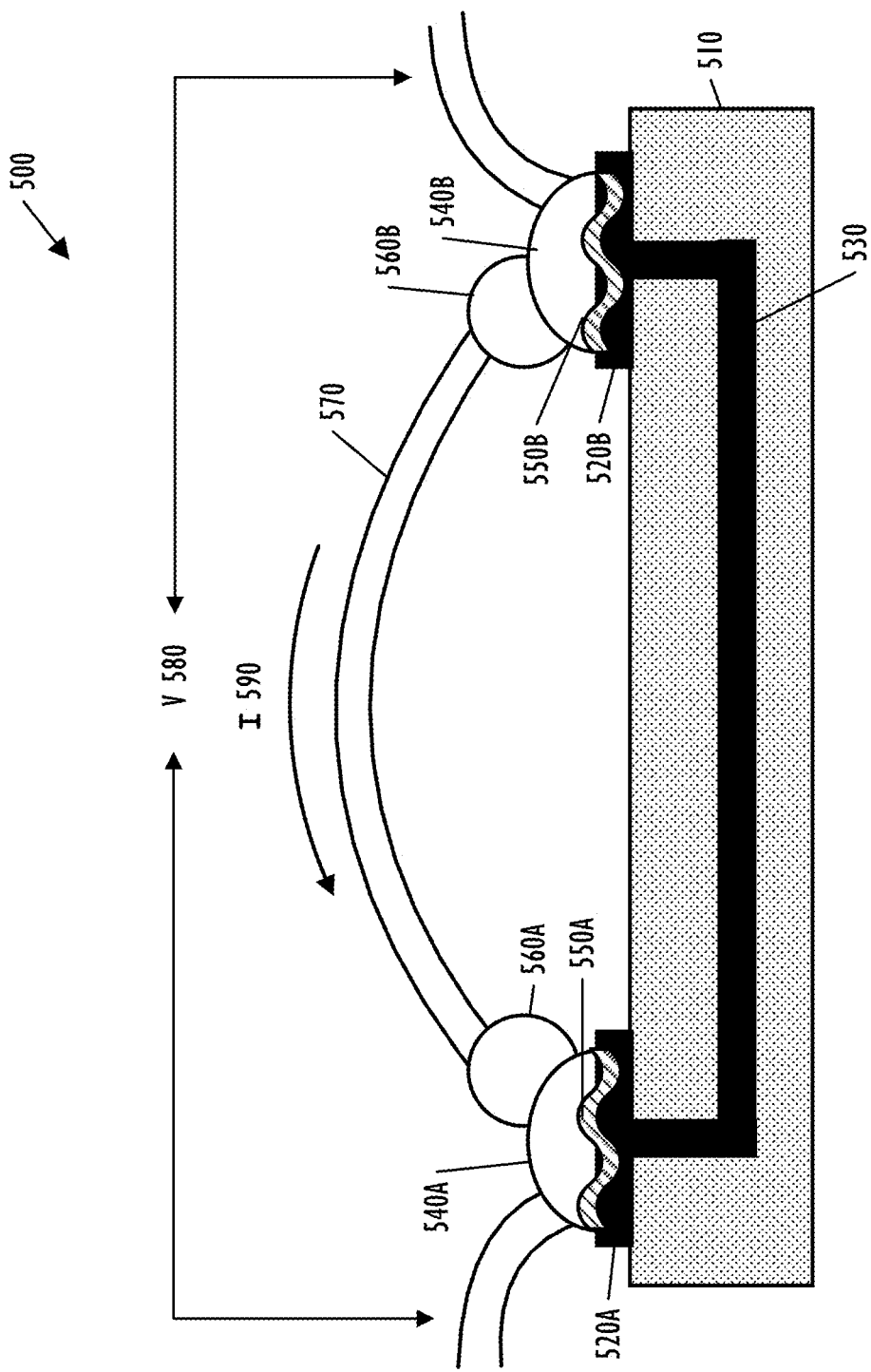
FIG. 5 shows a cross section of another example integrated circuit with stacked bond ball structures for the degradation sensor in the digital twin system shown in FIG. 3.

The degradation sensor 310 is described further herein with respect to FIGS. 4-5 and includes a stacked bond ball structure 315 and a resistance-sensing circuit 320. The stacked bond ball structure 315 is a first bond ball on a bond pad and a second bond ball positioned on the first bond ball. The resistance-sensing circuit 320 is configured to measure a resistance of the interface between the first bond ball and the bond pad in the stacked bond ball structure 315. In some implementations, the resistance-sensing circuit 320 is a four-terminal resistance-sensing circuit. The stacked bond ball structure 315 enables a four point electric resistance measurement, which may be more accurate than a two point resistance measurement enabled by a single bond ball because the contact resistance of the probes in the four-terminal resistance-sensing circuit are not measured. In addition, the resistance between the first and second bond balls may be sufficiently less than the resistance of the interface between the first bond ball and the bond pad such that the resistance of the interface between the first bond ball and the bond pad may be accurately determined.

The output 325 from the degradation sensor 310 can be the measured resistance of the interface between the first bond ball and the bond pad in the stacked bond ball structure 315 or information from which the resistance of the interface can be determined, such as the measured voltage and current from a four-terminal resistance-sensing circuit. The degradation modelling controller 330 receives the output 325 from the degradation sensor 310 and determines an amount of degradation of the interface based on the output 325. For example, the degradation modelling controller 330 may include a model for the relationship between degradation of the bond pad to bond ball interface and the resistance of the interface. The output 340 from the degradation modelling controller 330 is provided to other systems, which can adjust one or more operating parameters or perform an operation based on the output 340.

In some implementations, the output 340 from the degradation modelling controller 330 is the determined amount of degradation of the interface. In other implementations, the degradation modelling controller 330 estimates a "remaining useful life" of the interface, which can represent a predicted amount of time before the interface degrades below a threshold of performance. In some implementations, the controller receives multiple outputs 325 from the degradation sensor 310 over time and determines the "remaining useful life" of the interface based on the historical outputs 325 as well as the current output 325. For example, the degradation modelling controller 330 may update the model of the relationship between the degradation of the interface and the resistance of the interface based on the historical outputs over time.

In some implementations, the digital twin system 300 also includes the optional embedded sensor 350, such as a temperature sensor, a humidity sensor, or the like. The model for the relationship between degradation of the bond pad to bond ball interface and the resistance of the interface may further model the influence of temperature, humidity, and the like. The output 355 from the embedded sensor 350 is provided to the degradation modelling controller 330, which can then determine the amount of degradation of the interface based on both the output 325 from the degradation sensor 310 and the output 355 from the optional embedded sensor 350.

In some implementations, the digital twin system 300 also includes the remote sensor 360, such as a temperature sensor, a humidity sensor, or the like. For example, the remote sensor 360 can be a shared temperature sensor for the digital twin system 300 and other systems, such as a battery management system. In implementations including both embedded sensor 350 and remote sensor 360, the types of sensors 350 and 360 can be chosen to complement each other. For example, the remote sensor 360 can be the shared temperature sensor, and the embedded sensor 350 can be a humidity sensor. The remote sensor 360 outputs the remote sensor data 365. In some implementations, the remote sensor 360 outputs the remote sensor data 365 directly to the degradation modelling controller 330, which can then determine the amount of degradation of the interface based on both the output 325 from the degradation sensor 310 and the output 365 from the optional remote sensor 360.

In other implementations, the remote sensor 360 outputs the remote sensor data 365 to the filter 370. The filter 370 applies a transfer function to the remote sensor data 365 to convert the remote data values to approximate local data values 375 at the degradation sensor 310. For example, the remote sensor 360 is a temperature sensor, and the filter 370 converts the remote temperature data 365 to approximate temperature values 375 at the degradation sensor 310. The output 375 from the filter 370 is provided to the degradation modelling controller 330, which can then determine the amount of degradation of the interface based on both the output 325 from the degradation sensor 310 and the output 375 from the optional filter 370.

In some implementations, the digital twin system 300 also includes the optional historical data storage 380, which may be used to store instructions and/or data received from the degradation modelling controller 330 over bus 385. The historical data storage 380 may be any appropriate non-transitory computer readable storage medium, such as one or more non-volatile memory devices. The degradation modelling controller 330 can store historical data such as historical values of output 340 from the degradation modelling controller 330, historical values of output 325 from degradation sensor 310, historical values of output 355 from optional embedded sensor 350, historical values of output 365 from optional remote sensor 360, and historical values of output 375 from optional filter 370. For example, the degradation modelling controller 330 may update the model of the degradation of the interface based on the historical data in storage 380 and further determine the amount of degradation of the interface based on the historical data. For example, the embedded sensor 350 is a humidity sensor, and the remote sensor 360 is a temperature sensor. The degradation modelling controller 330 can determine the degradation D of the interface, which can be represented as:

$$D = \sqrt{A\left(e^{(\alpha)(RH)}\right)\left(e^{\frac{-Ea}{k_B T}}\right)t}$$

where A represents an expected rate of degradation, α represents a humidity coefficient, RH represents a relative humidity measured by the embedded humidity sensor 350, Ea represents an activation energy of a component material of the interface, kB represents the Boltzmann constant, T represents a temperature measured by the remote temperature sensor 360, and t represents time.

In addition to historical sensor data, storage 380 can also store historic use data for the system. For example, the digital twin system 300 can be included in an automotive driving assistance system on a vehicle, and the historical data storage 380 can store information about the vehicle's usage, such as the total number of miles it has been driven, how often it is driven, what conditions it is driven in, what conditions it is parked in, and the like. Then, the degradation modelling controller 330 may update the model of the degradation of the interface based on the historical use data in storage 380 and further determine the amount of degradation of the interface based on the historical use data in storage 380.

FIG. 4 shows a cross section of an example integrated circuit (IC) 400 with a stacked bond ball structure for the degradation sensor 310 in the digital twin system 300 shown in FIG. 3. The example IC 400 includes a substrate 410, bond pads 420A-C, electrical connection 430 between the bond pads 420A-C, bond balls 440A-C, stacked bond ball 460, and wire bonds 470A-B. The bond ball 440A is positioned on bond pad 420A, the bond ball 440B is positioned on bond pad 420B, and the bond ball 440C is positioned on bond pad 420C. The stacked bond ball 460 is positioned on the bond ball 440B, and the bond ball 440B and the stacked bond ball 460 form a stacked bond ball structure. The wire bond 470A couples the bond ball 440A to the bond ball 440B, and the wire bond 470B couples the stacked bond ball 460 to the bond ball 440C.

The interface 450 between the bond ball 440B and the bond pad 420B can experience degradation over time, just as the other bond pad to bond ball interfaces on the device experience, such that the interface 450 can be incorporated into a digital twin system such as digital twin system 300 shown in FIG. 3. The resistance of the interface 450 can be measured to model the degradation experienced by the other bond pad to bond ball interfaces and predict an amount of remaining useful life for the bond pad to bond ball interfaces. For example, a four-terminal resistance-sensing system can be used to measure a voltage V 480 using the bond balls 440A and 440B and wire bond 470A and a current I 490 using the bond ball 440C and the stacked bond ball 460. Based on the measured voltage V 480 and measured current I 490, the resistance of the interface 450 can be determined.

In this example, the current I 490 is shown through the stacked bond ball 460 and the bond ball 440C, and the voltage V 480 is shown across the bond balls 440A and 440B, but in other implementations, the current I 490 may be measured through the bond balls 440A and 440B, and the voltage 480 may be measured across the stacked bond ball 460 and the bond ball 440C. The stacked bond ball structure comprising the bond ball 440B and the stacked bond ball 460 enables a four point electric resistance measurement, which may be more accurate than a two point resistance measurement enabled by the bond ball 440B alone because the contact resistance of the probes in the four-terminal resistance-sensing circuit are not measured.

FIG. 5 shows a cross section of another example IC 500 with two stacked bond ball structures for the degradation sensor 310 in the digital twin system 300 shown in FIG. 3. The example IC 500 is similar to the example IC 400 shown in FIG. 4 but includes two stacked bond balls 560A and 560B, only two bond pads 520A and 520B, only two bond balls 540A and 540B, and only one wire bond 570. The bond ball 540A is positioned on bond pad 520A, and the bond ball 540B is positioned on bond pad 520B. The stacked bond ball 560A is positioned on the bond ball 540A and together form a stacked bond ball structure. Similarly, the stacked bond ball 560B is positioned on the bond ball 540B and together form a stacked bond ball structure. The wire bond 570 couples the stacked bond ball 560A to the stacked bond ball 560B.

In the example IC 500, the resistance of two interfaces can be monitored: the interface 550A between the bond ball 540A and the bond pad 520A and the interface 550B between the bond ball 540B and the bond pad 520B. The resistance of the interfaces 550A and 550B can be measured to model the degradation experienced by the other bond pad to bond ball interfaces and predict an amount of remaining useful life for the bond pad to bond ball interfaces. For example, a four-terminal resistance-sensing system can be used to measure a voltage V 580 using the bond balls 540A and 540B and a current I 590 using the stacked bond balls 560A and 560B and wire bond 570. Based on the measured voltage V 580 and measured current I 590, the resistance of the interfaces 550A and 550B can be determined.

In this example, the current I 590 is shown through the stacked bond balls 560A and 560B, and the voltage V 580 is shown across the bond balls 540A and 540B, but in other implementations, the current I 590 may be measured through the bond balls 540A and 540B, and the voltage V 580 may be measured across the stacked bond balls 560A and 560B. The stacked bond ball structures enable a four point electric resistance measurement, which may be more accurate than a two point resistance measurement enabled by the bond balls 540A and 540B alone because the contact resistance of the probes in the four-terminal resistance-sensing circuit are not measured.

Figure 6:
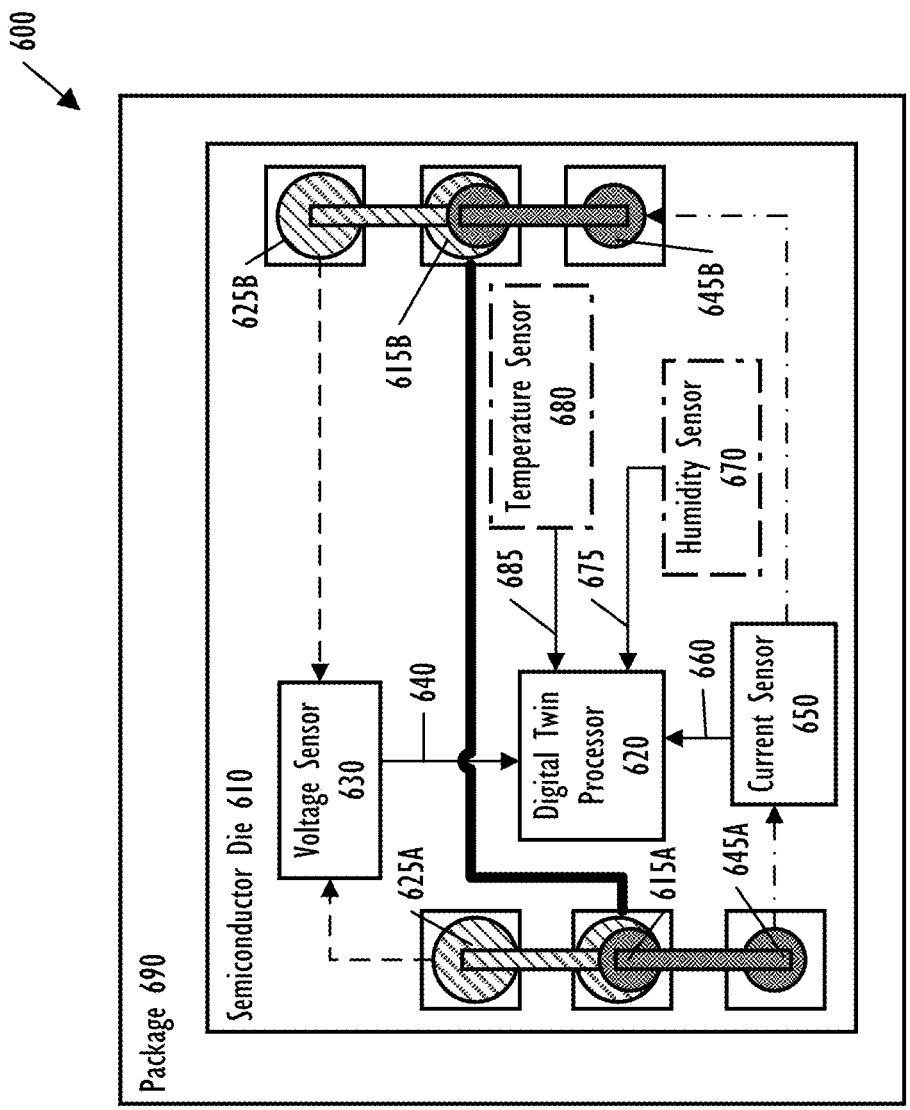
FIG. 6 shows an example digital twin system for monitoring degradation in a bond pad to bond ball interface incorporated into a single integrated circuit and package.

FIG. 6 shows an example digital twin system 600 for monitoring degradation in a bond pad to bond ball interface encapsulated in a single semiconductor die 610 and package 690. The digital twin system 600A includes the semiconductor die 610, the stacked bond ball structures 615A and 615B, and the package 690. The semiconductor die 610 includes the digital twin processor 620, the voltage sensing pads 625A and 625B, the voltage sensor 630, the current sensing pads 645A and 645B, and the current sensor 650. In some implementations, the semiconductor die 610 also includes the optional humidity sensor 670, the temperature sensor 680, or both. The voltage sensor 630 measures a voltage across voltage sensing pads 625A and 625B and provides the measured voltage 640 to the digital twin processor 620. The current sensor 650 measures a current from current sensing pad 645A to current sensing pad 645B and provides the measured current 660 to the digital twin processor 620.

The digital twin processor 620 can perform the operations of degradation modelling controller 330 shown in FIG. 3 and determine an amount of degradation of the interfaces between the first bond balls in the stacked bond ball structures 615A and 615B and the corresponding bond pads. In implementations including the optional humidity sensor 670, the measured humidity 675 is provided to the digital twin processor 620 as well, and the digital twin processor 620 further determines the amount of degradation of the interfaces based on the measured humidity 675. In implementations including the optional temperature sensor 680, the measured temperature 685 is provided to the digital twin processor 620 as well, and the digital twin processor 620 further determines the amount of degradation of the interfaces based on the measured temperature 685.

The digital twin system 600 shown in FIG. 6 encapsulates the digital twin processor 620, the stacked bond ball structures 615A and 615B, and the optional sensors 670 and 680 in a single semiconductor die 610 and a single package 690. In other embodiments, the digital twin processor 620, the stacked bond ball structures 615A and 615B, and the optional sensors 670 and 680 can be separated between multiple semiconductor dies 610 and encapsulated in one or more packages 690. For example, in FIG. 7, the digital twin system 700 includes four semiconductor dies 710A, 710B, 710C, and 710D encapsulated in a single package 790. The semiconductor die 710A includes the stacked bond ball structures 715A and 715B, the voltage sensing pads 725A and 725B, the voltage sensor 730, the current sensing pads 745A and 745B, and the current sensor 750. The semiconductor die 710B includes the digital twin processor 720, the semiconductor die 710C includes the humidity sensor 770, and the semiconductor die 710D includes the temperature sensor 780. The semiconductor dies 710A-D are encapsulated in a single package 790.

In other embodiments, the semiconductor dies 710A-D are encapsulated in multiple packages 790. For example, in FIG. 8, the digital twin system 800 includes four semiconductor dies 810A-D and four packages 890A-D. On semiconductor die 810A, the stacked bond ball structures 815A and 815B are coupled to output pins 865A-D. The stacked bond ball structure 815A is coupled to pin 865A for a voltage sensing output 825A and to pin 865C for a current sensing output 845A. The stacked bond ball structure 815B is coupled to pin 865B for a voltage sensing output 825B and to pin 865D for a current sensing output 845B.

Figure 7:
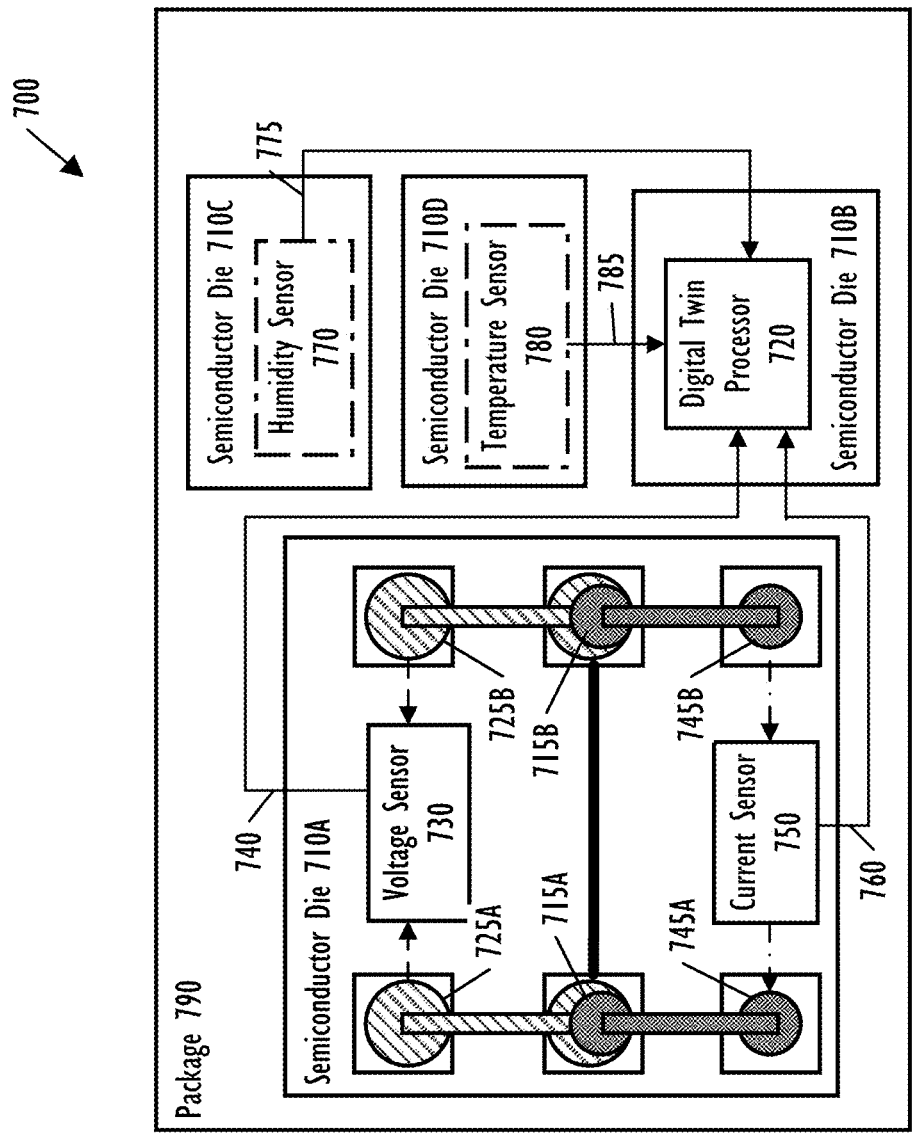
FIG. 7 shows an example digital twin system for monitoring degradation in a bond pad to bond ball interface incorporated into multiple integrated circuits in a single package.
Figure 8:
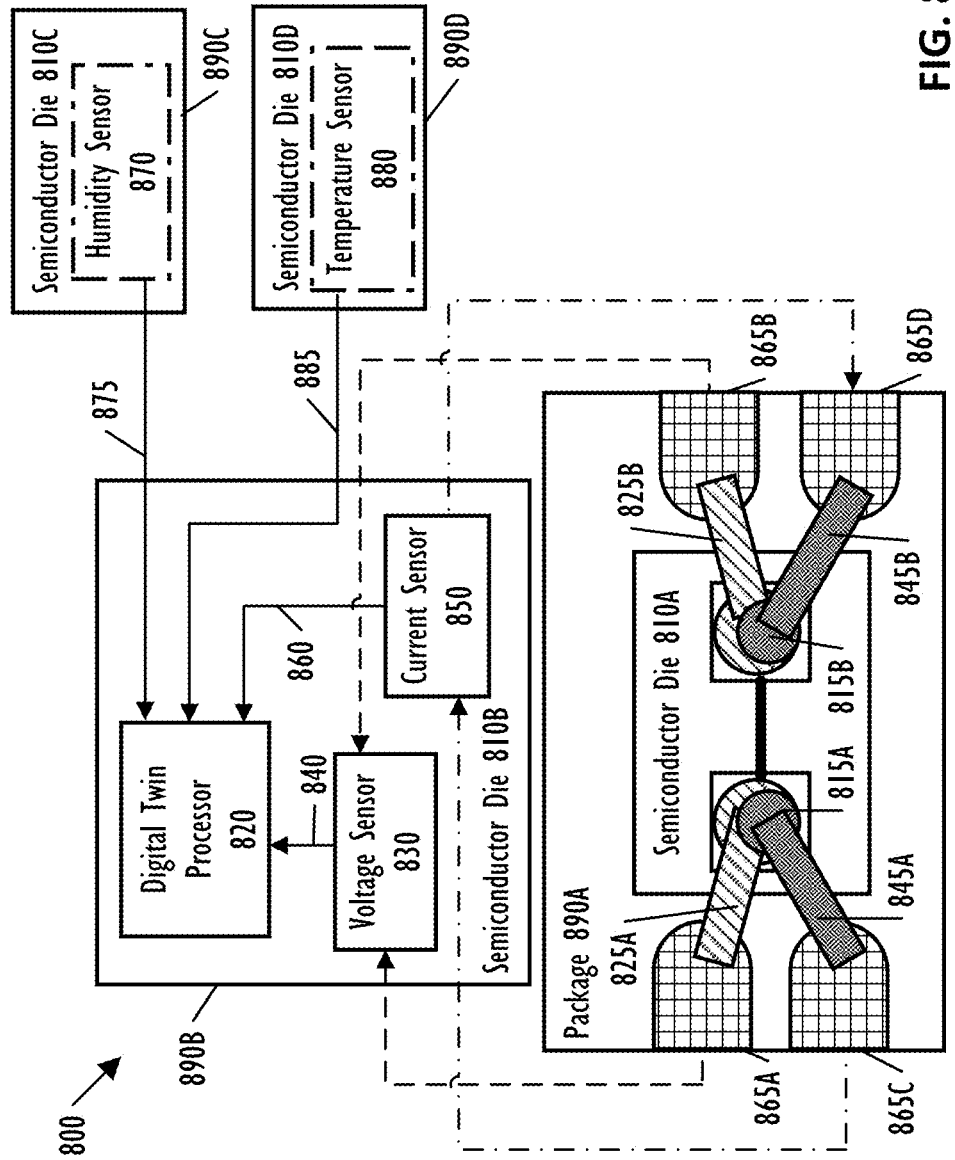
FIG. 8 shows an example digital twin system for monitoring degradation in a bond pad to bond ball interface incorporated into multiple integrated circuits in multiple packages.

The semiconductor die 810B includes the digital twin processor 820, the voltage sensor 830, and the current sensor 850. The voltage sensor 830 is coupled to pins 865A and 865B in package 890A, and the current sensor 850 is coupled to pins 865C and 865D in package 890A. The semiconductor die 810B is encapsulated in package 890B. The semiconductor die 810C includes the optional humidity sensor 870 and is encapsulated in package 890C. The semiconductor die 810D includes the optional temperature sensor 880 and is encapsulated in package 890D. The combinations of semiconductor dies and packages of digital twin systems 600, 700, and 800 shown in FIGS. 6, 7, and 8 are examples and can be combined or modified based on the particular implementation. In addition, the digital twin systems 600, 700, and 800, shown in FIGS. 6, 7, and 8 illustrate the example implementation with two stacked bond ball structures described in FIG. 5, but in other implementations, the digital twin systems 600, 700, and 800 may be implemented with the single stacked bond ball structure described in FIG. 4.

Features specifically shown or described with respect to one embodiment set forth herein may be implemented in other embodiments set forth herein.

In this description, the term "couple" may cover connections, communications, or signal paths that enable a functional relationship consistent with this description, including intermediate or intervening components that do not alter the functional relationship. A device that is "configured to" perform a task or function may be configured by programming or hardwiring, for example, at a time of manufacturing by a manufacturer and/or may be configurable or reconfigurable by a user after manufacturing. The configuring may be done through firmware and/or software, construction and/or layout of hardware components and connections, or any combination thereof. As used herein, "node", "pin", and "lead" are used interchangeably. A circuit or device described herein as including certain components may be adapted to be coupled to those components instead, to form the described circuitry or device.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A device, comprising:
   a substrate comprising a bond pad; and
   a stacked bond ball structure comprising a first bond ball in contact with the bond pad and a second bond ball positioned on the first bond ball, wherein the stacked bond ball structure is configured to be coupled to a resistance-sensing circuit such that a resistance of an interface between the first bond ball and the bond pad can be measured based on a voltage measurement across a third bond ball and one of the first bond ball and second bond ball to determine an amount of degradation of the interface between the first bond ball and the bond pad.

2. The device of claim 1, further comprising a controller configured to:
   obtain a measured resistance of the interface between the first bond ball and the bond pad from the resistance-sensing circuit; and
   determine the amount of degradation of the interface between the first bond ball and the bond pad based at least in part on the measured resistance of the interface.

3. The device of claim 2, wherein:
   the bond pad is a first bond pad;
   the substrate further comprises a second bond pad and a third bond pad, wherein the first, second, and third bond pads are electrically connected by an electrical connection in the substrate;
   the device further comprises:
      the third bond ball in contact with the second bond pad;
      a fourth bond ball in contact with the third bond pad; and
      the resistance-sensing circuit, comprising:
         a current sensor for measuring a current between the stacked bond ball structure and the third bond ball which are directly connected by a wire bond; and
         a voltage sensor for measuring a voltage between the stacked bond ball structure and the fourth bond ball which are directly connected by a wire bond; and
   the controller is configured to determine the measured resistance of the interface between the first bond ball and the first bond pad based on a measured current from the current sensor and a measured voltage from the voltage sensor.

4. The device of claim 3, further comprising:
   a first semiconductor die having the substrate, the stacked bond ball structure, and the third and fourth bond balls; and
   a second semiconductor die having the controller.

5. The device of claim 4, wherein the resistance-sensing circuit is comprised on one of the first semiconductor die, the second semiconductor die, and a third semiconductor die.

6. The device of claim 2, wherein:
   the bond pad is a first bond pad;
   the stacked bond ball structure is a first stacked bond ball structure;
   the substrate further comprises a second bond pad electrically connected to the first bond pad by an electrical connection in the substrate;
   the device further comprises:
      a second stacked bond ball structure comprising the third bond ball in contact with the second bond pad and a fourth bond ball positioned on the third bond ball; and
      the resistance-sensing circuit, comprising:
         a voltage sensor for measuring a voltage between the first bond ball and the third bond ball which are directly connected by a respective wire bond; and
         a current sensor for measuring a current between the second bond ball and the fourth bond ball which are directly connected by a wire bond; and
   the controller is further configured to determine the measured resistance of the interface between the first bond ball and the first bond pad based on a measured current from the current sensor and a measured voltage from the voltage sensor.

7. The device of claim 6, further comprising:
   a first semiconductor die having the substrate and the first and second stacked bond ball structures; and
   a second semiconductor die having the controller.

8. The device of claim 7, wherein the resistance-sensing circuit is comprised on one of the first semiconductor die, the second semiconductor die, and a third semiconductor die.

9. The device of claim 2, wherein the controller is further configured to obtain sensor data from a sensor, and wherein the controller is configured to determine the amount of degradation of the interface further based on the sensor data.

10. The device of claim 9, wherein the sensor data comprises at least one of temperature data, humidity data, and contamination data.

11. The device of claim 1, wherein the amount of degradation is further based on an expected rate of degradation which is a function of a relative humidity measurement, a temperature measurement, and a historical usage of the device.

12. The device of claim 1, wherein the resistance measurement is further based on a current measurement between a fourth bond ball and another of the first and second bond ball; wherein the bond pad is directly coupled to an electrical connection in the substrate; and wherein the first bond ball and the second bond ball are directly connected to a respective wire bond.

13. An apparatus, comprising:
   a substrate comprising a bond pad;
   an embedded degradation sensor coupled to the bond pad and comprising:
      a first bond ball in contact with the bond pad;
      a second bond ball positioned on the first bond ball; and
      a resistance-sensing system configured to measure a resistance of an interface between the first bond ball and the bond pad based on a voltage measurement across a third bond ball and one of the first bond ball and second bond ball; and
   a controller configured to determine an amount of degradation of the interface between the first bond ball and the bond pad based at least in part on the resistance of the interface.

14. The apparatus of claim 13, wherein the controller is further configured to determine a remaining useful life of wire bonds in the apparatus based on the amount of degradation of the interface.

15. The apparatus of claim 13, further comprising a sensor, wherein the controller is further configured to:
   obtain sensor data from the sensor; and
   determine the amount of degradation of the interface further based on the sensor data.

16. The apparatus of claim 15, wherein the sensor is one of a temperature sensor, a humidity sensor, and a contamination sensor.

17. The apparatus of claim 15, further comprising a memory configured to store historical sensor data, wherein the controller is configured to determine the amount of degradation of the interface further based on the historical sensor data.

18. The apparatus of claim 14, further comprising a memory configured to store historical resistance data, wherein the controller is configured to determine the amount of degradation of the interface further based on the historical resistance data.

19. The apparatus of claim 13, wherein the amount of degradation is further based on an expected rate of degradation which is a function of a relative humidity measurement, a temperature measurement, and a historical usage of the device.

20. The apparatus of claim 13, wherein the resistance measurement is further based on a current measurement between a fourth bond ball and another of the first and second bond ball; wherein the bond pad is directly coupled to an electrical connection in the substrate; and wherein the first bond ball and the second bond ball are directly connected to a respective wire bond.

21. A method, comprising:
   measuring a resistance of an interface between a stacked bond ball structure and a bond pad based on a voltage measurement; and
   estimating, based at least in part on the measured resistance of the interface, a remaining useful life of wire bonds in a device comprising the stacked bond ball structure.

22. The method of claim 21, wherein measuring the resistance of the interface comprises:
   measuring a voltage across the interface; and
   measuring a current through the interface.

23. The method of claim 21, further comprising:
   obtaining at least one of temperature data, humidity data, and contamination data for the stacked bond ball structure; and
   determining the remaining useful life further based on the at least one of the temperature data, the humidity data, and the contamination data.

24. The method of claim 21, further comprising:
   storing, in a memory, the measured resistance of the interface;
   measuring, at a later time, the resistance of the interface to obtain an updated measured resistance; and
   estimating, based at least in part on the updated measured resistance and the stored measured resistance, an updated remaining useful life of wire bonds in the device.

25. The method of claim 21, wherein the useful life is further estimated based on an expected rate of degradation which is a function of a relative humidity measurement, a temperature measurement, and a historical usage of the device.

26. The method of claim 21, wherein the stacked bond ball structure comprises a first bond ball and a second bond ball; and wherein the voltage is further measured across a third bond ball and one of the first bond ball and second bond ball; wherein the resistance measurement is further based on a current measurement between a fourth bond ball and another of the first and second bond ball; wherein the bond pad is directly coupled to an electrical connection in the substrate; and wherein the first bond ball and the second bond ball are directly connected to a respective wire bond.

* * * * *